(12) United States Patent
Noda et al.

(10) Patent No.: US 12,113,333 B2
(45) Date of Patent: Oct. 8, 2024

(54) SURFACE EMITTING LASER ELEMENT AND MANUFACTURING METHOD OF THE SAME

(71) Applicants: KYOTO UNIVERSITY, Kyoto (JP); STANLEY ELECTRIC CO., LTD., Meguro-ku (JP)

(72) Inventors: Susumu Noda, Kyoto (JP); Yoshinori Tanaka, Kyoto (JP); Menaka De Zoysa, Kyoto (JP); Kenji Ishizaki, Kyoto (JP); Tomoaki Koizumi, Tokyo (JP); Kei Emoto, Tokyo (JP)

(73) Assignees: KYOTO UNIVERSITY, Kyoto (JP); STANLEY ELECTRIC CO., LTD., Tokyo (JP)

( * ) Notice: Subject to any disclaimer, the term of this patent is extended or adjusted under 35 U.S.C. 154(b) by 889 days.

(21) Appl. No.: 17/272,385

(22) PCT Filed: Aug. 29, 2019

(86) PCT No.: PCT/JP2019/033938
§ 371 (c)(1),
(2) Date: Mar. 1, 2021

(87) PCT Pub. No.: WO2020/050130
PCT Pub. Date: Mar. 12, 2020

(65) Prior Publication Data
US 2021/0328406 A1     Oct. 21, 2021

(30) Foreign Application Priority Data

Sep. 3, 2018   (JP) .................................. 2018-164927

(51) Int. Cl.
*H01S 5/00*       (2006.01)
*H01S 5/11*       (2021.01)
(Continued)

(52) U.S. Cl.
CPC ................ *H01S 5/11* (2021.01); *H01S 5/183* (2013.01); *H01S 5/185* (2021.01);
(Continued)

(58) Field of Classification Search
CPC . H01S 5/11; H01S 5/183; H01S 5/185; H01S 5/34333; H01S 5/04254; H01S 5/2009; H01S 2304/04
See application file for complete search history.

(56) References Cited

U.S. PATENT DOCUMENTS 7,206,488 B1 *   4/2007   Altug .................. G02B 6/1225
                                                          385/132
2007/0036189 A1 *   2/2007   Hori .................... H01S 5/18358
                                                          372/50.11
(Continued)

FOREIGN PATENT DOCUMENTS

JP     2004111766 A     4/2004
JP     2007234835 A     9/2007
(Continued)

OTHER PUBLICATIONS

International Search Report (ISR) (and English translation thereof) dated Nov. 26, 2019 issued in International Application No. PCT/JP2019/033938.
(Continued)

*Primary Examiner* — Kinam Park
(74) *Attorney, Agent, or Firm* — Holtz, Holtz & Volek PC

(57) ABSTRACT

A surface emitting laser element formed of a group III nitride semiconductor, comprising: a first clad layer of a first conductivity type; a first guide layer of the first conductivity type having a photonic crystal layer formed on the first clad layer including voids disposed having two-dimensional periodicity in a surface parallel to the layer and a first embedding layer formed on the photonic crystal layer; a second embed-
(Continued)

ding layer formed on the first embedding layer by crystal growth; an active layer formed on the second embedding layer; a second guide layer formed on the active layer; and a second clad layer of a second conductivity type formed on the second guide layer, the second conductivity type being a conductivity type opposite to the first conductivity type. The first embedding layer has a surface including pits disposed at surface positions corresponding to the voids.

14 Claims, 10 Drawing Sheets

(51) Int. Cl.
*H01S 5/183* (2006.01)
*H01S 5/185* (2021.01)
*H01S 5/343* (2006.01)
*C30B 25/18* (2006.01)
*C30B 29/40* (2006.01)
*H01S 5/042* (2006.01)
*H01S 5/20* (2006.01)

(52) U.S. Cl.
CPC .......... *H01S 5/34333* (2013.01); *C30B 25/18* (2013.01); *C30B 29/403* (2013.01); *H01S 5/04254* (2019.08); *H01S 5/2009* (2013.01); *H01S 2304/04* (2013.01)

(56) References Cited

U.S. PATENT DOCUMENTS

| | | | |
|---|---|---|---|
| 2007/0109639 A1 | 5/2007 | Trevor et al. | |
| 2007/0201526 A1 | 8/2007 | Hori | |
| 2007/0280318 A1 | 12/2007 | Yoshimoto et al. | |
| 2010/0246625 A1 | 9/2010 | Kawashima et al. | |
| 2011/0039364 A1 | 2/2011 | Kawashima et al. | |
| 2011/0237077 A1* | 9/2011 | Kawashima | H01L 29/2003 257/E21.333 |
| 2012/0018758 A1* | 1/2012 | Matioli | H01S 5/1017 257/E31.127 |
| 2012/0269224 A1* | 10/2012 | Nagatomo | H01S 5/185 372/29.014 |
| 2013/0121358 A1* | 5/2013 | Hirose | H01S 5/11 438/46 |
| 2014/0097456 A1* | 4/2014 | Kawashima | H01L 27/156 438/34 |
| 2014/0327015 A1 | 11/2014 | Kawashima et al. | |
| 2019/0067911 A1* | 2/2019 | Caër | H01L 21/246 |
| 2020/0251887 A1 | 8/2020 | Noda et al. | |
| 2021/0013700 A1 | 1/2021 | Noda et al. | |

FOREIGN PATENT DOCUMENTS

| | | |
|---|---|---|
| JP | 2009130110 A | 6/2009 |
| JP | 2009302250 A | 12/2009 |
| JP | 2010109223 A | 5/2010 |
| JP | 4818464 B2 | 7/2010 |
| JP | 2010232488 A | 10/2010 |
| JP | 2011035078 A | 2/2011 |
| JP | 2011119349 A | 6/2011 |
| JP | 5082447 B2 | 9/2012 |
| JP | 2013135001 A | 7/2013 |
| WO | 2006062084 A1 | 6/2006 |
| WO | 2011013363 A1 | 2/2011 |
| WO | 2018155710 A1 | 8/2018 |

OTHER PUBLICATIONS

Written Opinion dated Nov. 26, 2019 issued in International Application No. PCT/JP2019/033938.
Kawashima, et al., "GaN-based surface-emitting laser with two-dimensional photonic crystal acting as distributed-feedback grating and optical cladding", Applied Physics Letters, Dec. 22, 2010, vo. 97, p. 251112.
Liang, et al., "Three-dimensional coupled-wave model for square-lattice photonic crystal lasers with transverse electric polarization: A general approach", Phys. Rev. B vol. 84 (2011) 195119.
Miyake, et al., "Effects of Reactor Pressure on Epitaxial Lateral Overgrowth of GaN via Low-Pressure Metalorganic Vapor Phase Epitaxy", 1999 Jpn. J. Appl. Phys. 38 L 1000.
Tanaka, et al., "Discussion of In-plane Diffraction and Threshold Gain Difference in PCSEL", Preprints of Autumn Meeting of 2016 of Japan Society of Applied Physics.
Yoshimoto, et al., "GaN Photonic-Crystal Surface-Emitting Laser Operating at Blue-Violet Wavelengths", Laser and Electro-Optics Society (LEOS) 2008, Nov. 2008, 21st Annual Meeting of the IEEE.
Tanaka, et al., "Discussion of In-plane Diffraction and Threshold Gain Difference in PCSEL", Preprints of Autumn Meeting of 2016 of the Japan Society of Applied Physics.
Extended European Search Report (EESR) dated May 10, 2022, issued in counterpart European Application No. 19858088.8.
Matioli, et al., "Growth of embedded photonic crystals for GaN-based optoelectronic devices", Journal of Applied Physics, American Institute of Physics.
Japanese Office Action (and English language translation thereof) dated Oct. 25, 2022, issued in counterpart Japanese Application No. 2018-164927.
Japanese Office Action (and English language translation thereof) dated Feb. 20, 2024, issued in counterpart Japanese Application No. 2023-072364.

* cited by examiner

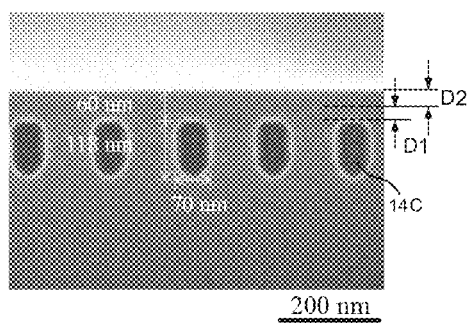
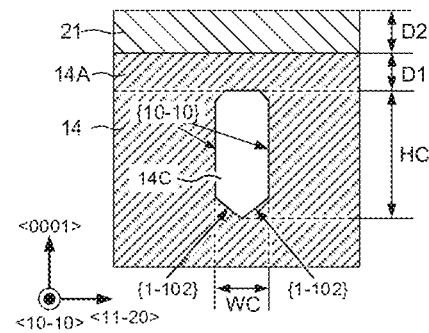
FIG. 7A
FIG. 7B

SURFACE EMITTING LASER ELEMENT AND MANUFACTURING METHOD OF THE SAME

TECHNICAL FIELD

The present invention relates to a surface emitting laser element and a manufacturing method of the same.

BACKGROUND ART

Recently, a development of a surface emitting laser using a photonic crystal has been advanced. For example, Patent Document 1 discloses a semiconductor laser device whose object is to perform manufacturing without fusion process. Additionally, Patent Document 2 discloses a manufacturing method that manufactures a microstructure of a photonic crystal into a GaN-based semiconductor. Non-Patent Document 1 discloses that a reduced-pressure growth increases a speed of a lateral growth to manufacture a photonic crystal. Non-Patent Document 2 discloses an in-plane diffraction effect and a threshold gain difference of a photonic crystal laser. Non-Patent Document 3 discloses a three-dimensional coupled wave model of a square lattice photonic crystal laser.

Patent Document 1: Japanese Patent No. 5082447
Patent Document 2: Japanese Patent No. 4818464
Non-Patent Document 1: H. Miyake et al.: Jpn. J. Appl. Phys. Vol. 38 (1999) pp. L1000-L1002
Non-Patent Document 2: Tanaka et al., Preprints of Autumn Meeting of 2016 of the Japan Society of Applied Physics, 15p-B4-20
Non-Patent Document 3: Y. Liang et al.: Phys. Rev. B Vol. 84 (2011) 195119

DISCLOSURE OF THE INVENTION

Problems to be Solved by the Invention

To perform an oscillation operation at a low threshold current density in a surface emitting laser including a photonic crystal, reduction of a resonator loss is necessary. To reduce the resonator loss in the photonic crystal surface emitting laser, increasing a coupling coefficient of a light wave propagating in a direction parallel to a photonic crystal layer (one-dimensional coupling coefficient: $\kappa_3$) is effective.

The present invention has been made in consideration of the above-described points and an object of which is to provide a surface emitting laser that includes a photonic crystal having a large coupling coefficient with respect to a light wave propagating a photonic crystal layer and allows an oscillation operation at a low threshold current density, and a manufacturing method of the surface emitting laser.

Solutions to the Problems

A surface emitting laser element according to a first embodiment of the present invention is a surface emitting laser element formed of a group III nitride semiconductor, comprising:
a first clad layer of a first conductivity type;
a first guide layer of the first conductivity type having a photonic crystal layer formed on the first clad layer including voids disposed having two-dimensional periodicity in a surface parallel to the layer and a first embedding layer formed on the photonic crystal layer wherein the first embedding layer closes the voids;
a second embedding layer formed on the first embedding layer by crystal growth;
an active layer formed on the second embedding layer;
a second guide layer formed on the active layer; and
a second clad layer of a second conductivity type formed on the second guide layer, the second conductivity type being a conductivity type opposite to the first conductivity type, wherein
the first embedding layer has a surface including pits disposed at surface positions corresponding to the voids.

A manufacturing method according to another embodiment of the present invention is a manufacturing method for manufacturing a surface emitting laser element formed of a group III nitride semiconductor by a MOVPE method, the manufacturing method comprising:
(a) a step of growing a first clad layer of a first conductivity type on a substrate;
(b) a step of growing a first guide layer of the first conductivity type on the first clad layer;
(c) a step of forming hole portions disposed having two-dimensional periodicity in a surface parallel to the first guide layer in the first guide layer by etching;
(d) a step of supplying a gas containing a nitrogen source to form a first embedding layer closing openings of the hole portions by mass transport;
(e) a step of supplying a group III raw material after the formation of the first embedding layer to form a second embedding layer that embeds the first embedding layer for flattering, wherein
in the step (d), the first embedding layer has a surface including pits derived from voids.

BRIEF DESCRIPTION OF THE DRAWINGS

FIG. 7A is a drawing illustrating a cross-sectional SEM image of a part of the n-guide layer 14 into which voids 14C are embedded.

FIG. 7B is a drawing schematically illustrating the cross-sectional surface illustrated in FIG. 7A.

DESCRIPTION OF PREFERRED EMBODIMENTS

Figure 1:
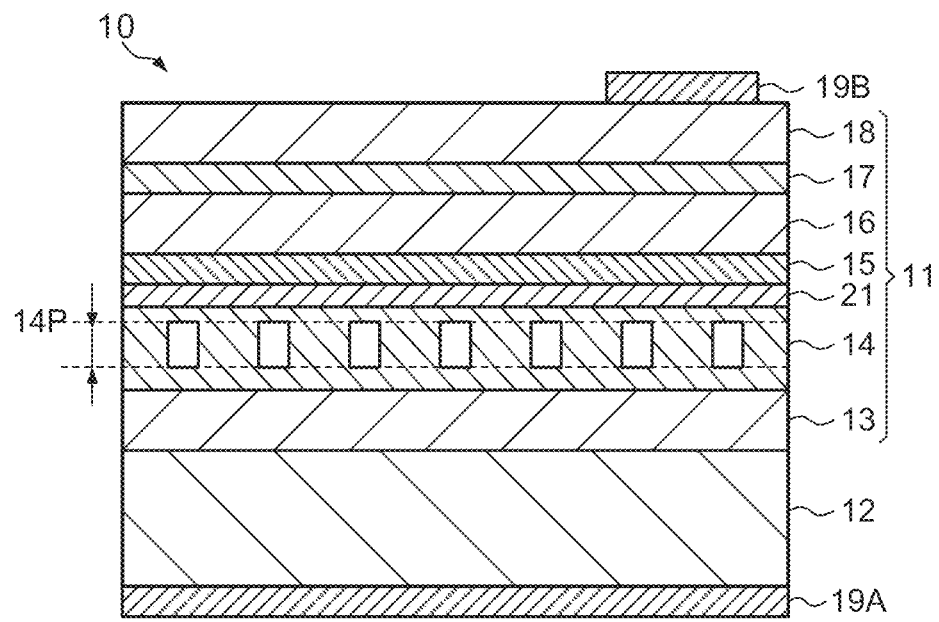
FIG. 1 is a cross-sectional view schematically illustrating an example of a structure of a surface emitting laser element that includes a photonic crystal layer according to an embodiment of the present invention.

While the following describes preferred embodiments of the present invention, these embodiments may be appropriately modified and combined. In the following description and attached drawings, same reference numerals are given to actually same or equivalent parts for the description.

[Threshold Gain of Photonic Crystal Surface Emitting Laser]

Generally, in the photonic crystal surface emitting laser (hereinafter also simply referred to as a photonic crystal laser), diffraction efficiency of diffraction grating inside a resonator is expressed by a coupling coefficient $\kappa$, and the larger the coupling coefficient $\kappa$ is, the smaller the threshold gain becomes.

In the photonic crystal surface emitting laser, a light wave that propagates inside a surface parallel to the photonic crystal layer is diffracted not only in ±180° direction with respect to a traveling direction of the light wave but also in ±90° direction. Accordingly, in addition to a coupling coefficient $\kappa_3$ (one-dimensional coupling coefficient) of the light wave that propagates in the ±180° direction, a coupling coefficient $\kappa_{2D}$ (two-dimensional coupling coefficient) of the light wave that propagates in ±90° direction is present.

That is, in the surface emitting laser including the photonic crystal, the light wave propagating inside the surface is diffracted by the diffraction effect of the photonic crystal, thus forming a two-dimensional resonance mode. Here, when a component of the light not diffracted by the photonic crystal leaks in the in-plane direction, a resonator loss increases, leading to an increase in threshold gain. Accordingly, as long as the resonator loss can be suppressed, the threshold gain can be reduced and an oscillation operation can be performed at a low threshold current density.

To reduce the resonator loss in the photonic crystal surface emitting laser and perform the oscillation operation at the low threshold current density, it is effective to increase the coupling coefficient ($\kappa_3$) of the light wave propagating inside the photonic crystal layer surface.

[Example of Structure of Photonic Crystal Surface Emitting Laser]

FIG. 1 is a cross-sectional view schematically illustrating an example of the structure of a surface emitting laser element (hereinafter also simply referred to as a photonic crystal laser) 10 including a photonic crystal layer. As illustrated in FIG. 1, a semiconductor structure layer 11 is formed on a substrate 12. More specifically, on the substrate 12, an n-clad layer 13, an n-guide layer 14 including a first embedding layer 14A, a second embedding layer 21, an active layer 15, a guide layer 16, an Electron Blocking Layer (EBL) 17, and a p-clad layer 18 are sequentially formed in this order. That is, the semiconductor structure layer 11 is constituted of the semiconductor layers 13, 14, 15, 16, 17, and 18. The n-guide layer 14 includes a photonic crystal layer 14P. The semiconductor structure layer 11 is formed of a hexagonal system nitride semiconductor. For example, the semiconductor structure layer 11 is formed of a GaN-based semiconductor.

On (a back surface of) the substrate 12, an n-electrode 19A is formed, and on (a top surface of) the p-clad layer 18, a p-electrode 19B is formed. For example, the p-electrode 19B can be formed in an appropriate shape surrounding a photonic crystal region, such as an annular shape.

In this case, the light from the surface emitting laser element 10 is taken out from the top surface of the semiconductor structure layer 11 (namely, the surface of the p-clad layer 18) to the outside in a direction perpendicular to the active layer 15.

A structure in which the light from the surface emitting laser element 10 is taken out from the lower surface side of the semiconductor structure layer 11 to the outside can be employed. In the case, for example, the n-electrode 19A can be formed in the annular shape and the p-electrode 19B can be disposed at a position facing the center of the n-electrode 19A.

Figure 2:
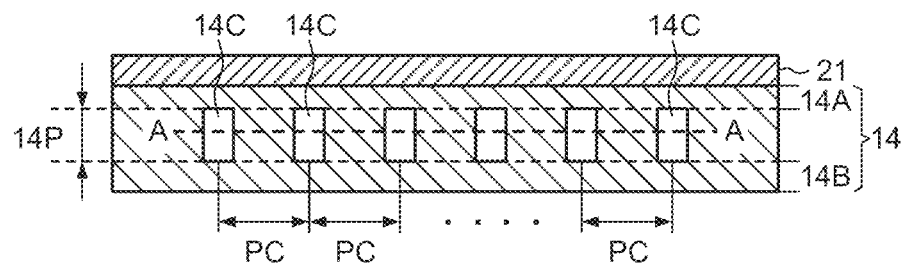
FIG. 2 is an enlarged cross-sectional view schematically illustrating the photonic crystal layer and voids (cavities) arrayed in the photonic crystal layer of FIG. 1.

FIG. 2 is an enlarged cross-sectional view schematically illustrating the photonic crystal layer 14P and voids (cavities) 14C arrayed in the photonic crystal layer 14P of FIG. 1. The voids 14C are arranged to have intervals PC on, for example, a square lattice pattern on a crystal growth surface (semiconductor stacked surface), namely, a surface parallel to the n-guide layer 14 (the cross-sectional surface A-A in the drawing), and the respective voids 14C are two-dimensionally arrayed at the square lattice point positions and embedded in the n-guide layer 14 to be formed. Note that the array of the voids 14C is not limited to the square lattice pattern, and only needs to be a periodic two-dimensional array, such as a triangular lattice pattern and a hexagonal lattice pattern.

The n-guide layer 14 comprises the first embedding layer 14A embedding the photonic crystal layer (PCL) 14P. The first embedding layer 14A is a semiconductor layer (that is, the semiconductor layer with top surfaces of the voids 14C as its bottom surface) on the top surfaces of the two-dimensionally arrayed voids 14C. The n-guide layer 14 also comprises the photonic crystal layer (PCL) 14P, and a base layer 14B as a crystal layer on the substrate side than the photonic crystal layer (PCL) 14P. Additionally, the second embedding layer 21 is formed on the first embedding layer 14A.

[Resonance Effect of Photonic Crystal Surface Emitting Laser]

To obtain the resonate effect in a surface emitting laser including a photonic crystal portion (hereinafter simply referred to as a photonic crystal surface emitting laser in some cases), it is desired to have a high diffraction effect in the photonic crystal portion.

That is, to increase the diffraction effect in the photonic crystal surface emitting laser, the following is preferred. (1) When an oscillation wavelength is denoted as $\lambda$ and an effective refractive index of the photonic crystal portion is denoted as $n_{eff}$, a two-dimensional refractive index cycle P in the photonic crystal portion meets $P=m\lambda/n_{\textit{eff}}$ (m is a natural number) in the case of the two-dimensional square lattice photonic crystal, and meets $P=m\lambda \times 2/(3^{1/2} \times n_{\textit{eff}})$ (m is a natural number) in the case of the two-dimensional triangular lattice photonic crystal. (2) A proportion (FF: filling factor) of a modified refractive index area to a base material in the photonic crystal portion is sufficiently large. (3) In a light intensity distribution in the photonic crystal surface emitting laser, a proportion ($\Gamma_{PC}$: confinement factor) of optical intensity distributed in the photonic crystal portion is sufficiently large.

To meet (1), it is necessary to appropriately set a lattice constant (interval PC) of the photonic crystal according to an oscillation wavelength of the photonic crystal laser. Here, since the refractive index cycle P=interval PC, PC can be set based on P meeting (1) described above. For example, in a case of an oscillation at a wavelength of 405 nm using a gallium-nitride-based material, $n_{\textit{eff}}$ is around 2.5. Therefore, with the use of the two-dimensional square lattice photonic crystal, the lattice constant is preferably set to be around 163 nm.

In the two-dimensional square lattice photonic crystal, a direction in which the light wave is diffracted is the same as the array direction of the lattices. Meanwhile, in the two-dimensional triangular lattice photonic crystal, the light wave is diffracted in a direction inclined with respect to the array direction of the lattices by 30°. Accordingly, in (1) described above, P is multiplied by $2/3^{1/2}$ in which the two-dimensional triangular lattice photonic crystal satisfies P.

Embodiment 1

[Growth of Clad Layer and Guide Layer]

Manufacturing steps of the semiconductor structure layer 11 will be described in detail below. As a crystal growth method, a Metalorganic Vapor Phase Epitaxy (MOVPE) method was used, and the semiconductor structure layer 11 was grown on the growth substrate 12 by normal pressure (atmospheric pressure) growth.

As a substrate for growth of the semiconductor structure layer 11, the n-type GaN substrate 12 having +c plane as a growth surface with c-axis inclined with respect to a-axis by 0.4° was employed. The inclination of the c-axis (off angle) may be appropriately changed in a range in which epitaxial growth is possible with the GaN-based semiconductor. On the substrate 12, an n-type AlGaN (layer thickness: 2 μm) having an aluminum (Al) composition of 4% was grown as the n-clad layer 13. As a group III MO (organic metal) material, trimethyl gallium (TMG) and trimethyl aluminum (TMA) were used and ammonia (NH$_3$) was used as a group V material. Additionally, silane (SiH$_4$) was supplied as a doping material. A carrier density at room temperature was approximately $2 \times 10^{18}$ cm$^{-3}$.

Subsequently, TMG and NH$_3$ were supplied and an n-type GaN (layer thickness: 300 nm) was grown as the n-guide layer 14. Silane (SiH$_4$) was supplied simultaneously with the growth, and thus doping was performed. The carrier density was approximately $2 \times 10^{18}$ cm$^{-3}$.

[Void Formation in Guide Layer]

Figure 3:
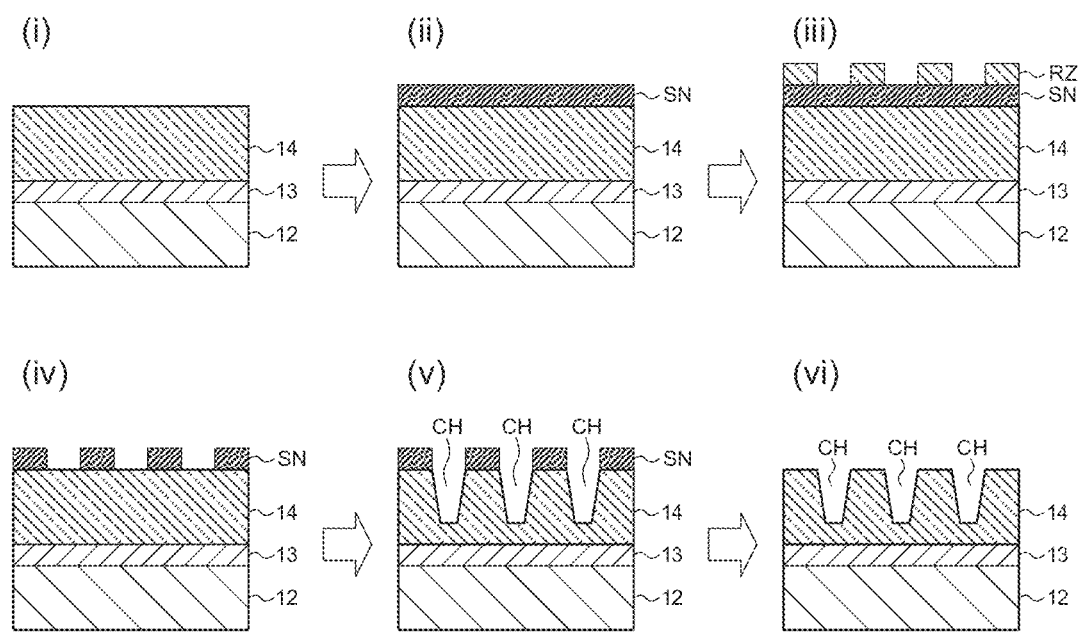
FIG. 3 includes cross-sectional views schematically illustrating a forming step of voids CH.
Figure 4A:
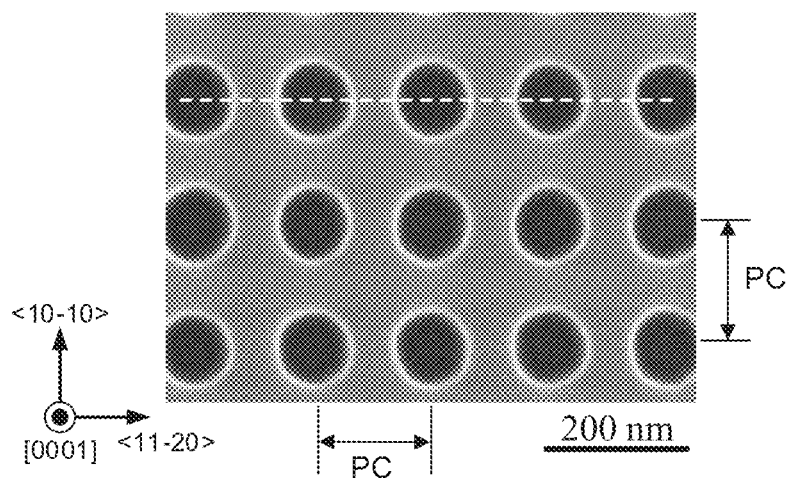
FIG. 4A is a drawing illustrating a SEM image of a surface of a guide layer substrate in a step after forming the voids CH.
Figure 4B:
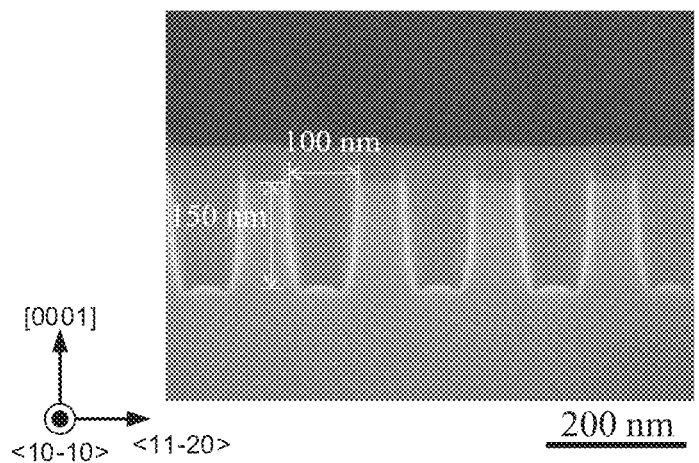
FIG. 4B is a drawing illustrating a SEM image of a cross-sectional surface of the guide layer substrate in the step after forming the voids CH.

The substrate in which the n-guide layer 14 had been grown, namely, the substrate with the n-guide layer 14 (hereinafter also referred to as a guide layer substrate) was taken out from a MOVPE apparatus and fine voids (holes) were formed in the n-guide layer 14. The following describes the formation of the voids in detail with reference to FIG. 3, FIG. 4A, and FIG. 4B. FIG. 3 is a cross-sectional view schematically illustrating the forming step of the voids CH. FIG. 4A and FIG. 4B each illustrate an image of a Scanning Electron Microscope (SEM) of a surface and a cross-sectional surface of the guide layer substrate in a step after forming the voids CH. FIG. 4B illustrates a cross-sectional SEM image taken along the dashed line (white) illustrated in the surface SEM image in FIG. 4A.

The guide layer substrate in which the n-clad layer 13 and the n-guide layer 14 had grown were cleaned to obtain a cleaned surface of the guide layer substrate (FIG. 3, (i)). Afterwards, a silicon nitride film (SiNx) SN was formed (film thickness 110 nm) by plasma CVD (FIG. 3, (ii)).

Next, an electron beam (EB) drawing resist RZ was applied over the SiNx film SN at a thickness around 300 nm by a spin coating method, and the resultant product was put in an electron beam drawing device, thus forming a pattern having a two-dimensional periodic structure on the surface of the guide layer substrate (FIG. 3, (iii)). More specifically, patterning of two-dimensionally arrayed circular dots having a diameter of 100 nm was performed at the interval PC=163 nm in a square lattice pattern in the surface of the resist RZ.

After developing the patterned resist RZ, the SiNx film SN was selectively dry-etched by an Inductive Coupled Plasma-Reactive Ion Etching (ICP-RIE) apparatus (FIG. 3, (iv)). Thus, column-shaped through-holes that were two-dimensionally arrayed in the square lattice pattern at the in-plane interval PC were formed in the SiNx film SN.

Subsequently, the resists RZ were removed, and using the patterned SiNx film SN as a hard mask, the voids CH were formed from the surface through the inside of the n-guide layer 14 (GaN). More specifically, the ICP-RIE apparatus performed a dry etching using a chlorine-based gas to form the two-dimensionally arrayed voids CH in the n-guide layer 14 (FIG. 3, (v)).

FIG. 4A and FIG. 4B illustrate the surface SEM image and the cross-sectional SEM image of the voids CH formed in the n-guide layer 14 at this time, respectively. As illustrated in the surface SEM image, the plurality of voids CH that are two-dimensionally arrayed in the square lattice pattern (namely, at square lattice points) at the interval (periodic) PC between the voids of 163 nm were formed. As illustrated in the cross-sectional SEM image of FIG. 4B, a depth of the void CH formed in the n-guide layer 14 was about 150 nm and the diameter of the void CH was about 100 nm. That is, the void CH was a depression (hole) opening to the top surface and had a substantially column shape.

[First Embedding Layer]

The SiNx film SN of the guide layer substrate in which the voids CH having the two-dimensional periodicity were formed in the n-guide layer 14 were removed using hydrofluoric acid (HF) (FIG. 3, (vi)), cleaning was performed to obtain a cleaned surface, and the resultant product was introduced into the MOVPE apparatus again.

In the MOVPE apparatus, the temperature was increased while NH$_3$ was supplied as a nitrogen source without supplying a group III raw material to heat the guide layer substrate up to 1150° C., and annealing was performed, for one minute after the temperature increase, to close the voids CH by mass transport, and the first embedding layer 14A was formed. Nitrogen (N$_2$) was supplied as an atmosphere gas.

Figure 5A:
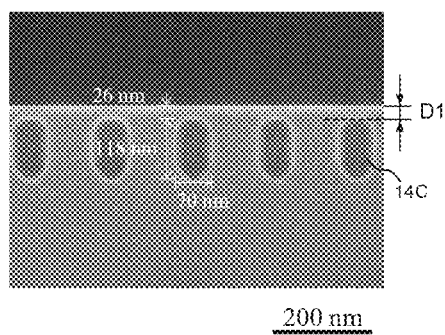
FIG. 5A is a drawing illustrating a cross-sectional SEM image of a part of an n-guide layer 14 into which the voids CH are embedded.
Figure 5B:
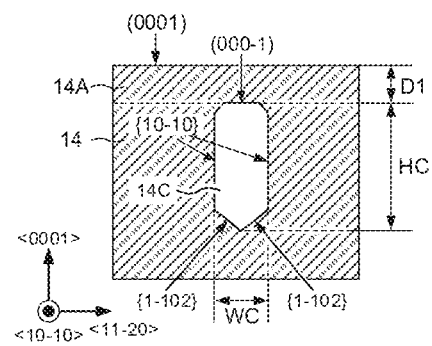
FIG. 5B is a drawing schematically illustrating the cross-sectional surface illustrated in FIG. 5A.

FIG. 5A illustrates the cross-sectional SEM image of a part of the n-guide layer 14 into which the voids CH are embedded, and FIG. 5B illustrates the schematic cross-sectional view of the part. As illustrated in FIG. 5A and FIG.

5B, voids (cavities) 14C having a hexagonal prism structure and having internal surfaces of {10-10} facets (facets in a predetermined plane direction), a width (WC) of 70 nm, and a depth (HC) of 118 nm were formed. More specifically, a (000-1) plane appeared on the surface (top surface) on the active layer 15 side of the void 14C, {10-10} planes appeared on side surfaces of the void 14C, and {1-102} facets appeared on bottom portions on the substrate 12 side.

At this time, on the top of the n-guide layer 14, the first embedding layer 14A was formed from the planar surface formed by the top surface of the void 14C through the surface of the n-guide layer 14. The first embedding layer 14A had a layer thickness (D1) of 26 nm.

Figure 6A:
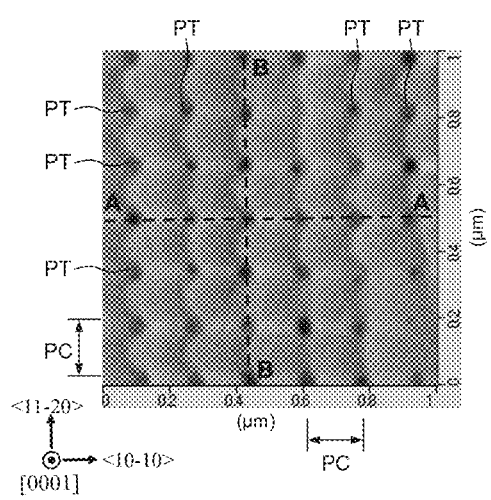
FIG. 6A is an AFM image illustrating a surface morphology of a first embedding layer 14A.
Figure 6B:
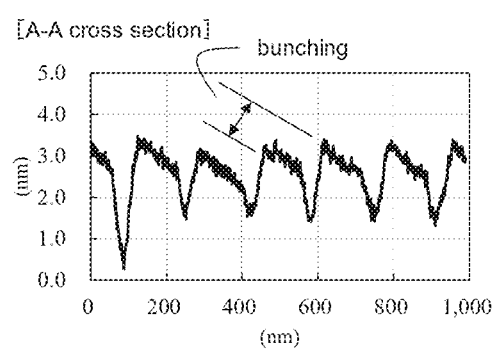
FIG. 6B is a graph illustrating surface roughness of a cross-sectional surface taken along the line A-A in FIG. 6A.
Figure 6C:
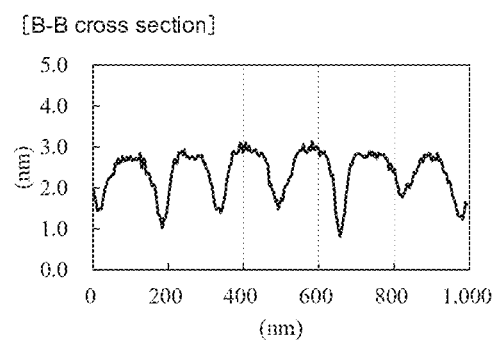
FIG. 6C is a graph illustrating surface roughness of a cross-sectional surface taken along the line B-B in FIG. 6A.

FIG. 6A is an image of an Atomic Force Microscope (AFM) illustrating a surface morphology of the first embedding layer 14A, FIG. 6B is a graph illustrating surface roughness of a cross-sectional surface taken along the line A-A in FIG. 6A, and FIG. 6C is a graph illustrating surface roughness of a cross-sectional surface taken along the line B-B in FIG. 6A. It was confirmed that the surface of the first embedding layer 14A was formed of a GaN (0001) plane and had a step-terrace structure in which bunching was performed at a width with almost the same order as that of the interval PC (=163 nm).

As illustrated in FIG. 6A, it was confirmed that pits PT appeared in a square lattice pattern at the interval of the voids 14C at surface positions corresponding to the voids 14C on the surface of the first embedding layer 14A. That is, it was confirmed that the pits PT appeared on the crystal orientation [0001] with respect to the voids 14C, and in this embodiment, when the first embedding layer 14A is viewed in top view, the pits PT appeared at the positions overlapping with the voids 14C. That is, the pits PT derived from or caused by the voids 14C appear on the surface of the first embedding layer 14A. Note that in a case where an off angle of the crystal is large, when the first embedding layer 14A is viewed in top view, there may be a case where the pits PT do not overlap with the voids 14C, but appear on the crystal orientation [0001] with respect to the voids 14C.

Note that, in the formation of the first embedding layer 14A, the pits PT do not need to be regularly arrayed in the two-dimensional array on the surface of the first embedding layer 14A. It is only necessary to form the first embedding layer 14A by mass transport so as to have a surface condition in which the pits PT remain on the surface of the first embedding layer 14A.

The first embedding layer 14A is not limited to be GaN. As the first embedding layer 14A, another crystal, for example, a ternary crystal or a quaternary crystal, GaN-based semiconductor crystal layer may be formed, and the first embedding layer 14A preferably has a refractive index higher than that of the n-clad layer 13. For example, AlGaN having an Al composition lower than that of the n-clad layer 13, InGaN, or the like can be used.

[Second Embedding Layer]

After forming the first embedding layer 14A, a group III material gas (TMG) and a group V material gas (NH$_3$) were supplied with a temperature maintained at 1150° C. to form the second embedding layer 21. In the embodiment, hydrogen (H$_2$) was supplied at the same time.

FIG. 7A illustrates a cross-sectional SEM image of a part of the n-guide layer 14 into which the voids 14C are embedded at this time, and FIG. 7B illustrates a schematic cross-sectional view of the part.

The second embedding layer 21 was able to be formed without changing the shape of the voids 14C. A sum of a thickness (D1=26 nm) of the first embedding layer 14A and a thickness (D2=34 nm) of the second embedding layer 21 in this case was 60 nm.

Figure 8A:
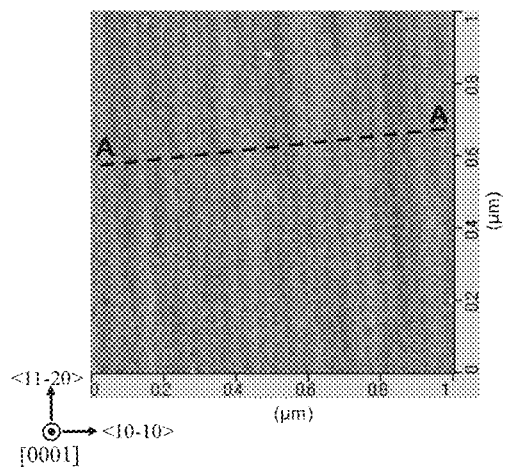
FIG. 8A is an AFM image illustrating a surface morphology of a second embedding layer 21.
Figure 8B:
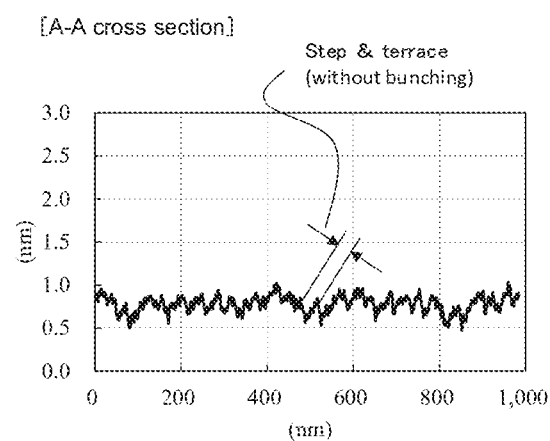
FIG. 8B is a graph illustrating surface roughness of a cross-sectional surface taken along the line A-A in FIG. 8A.

FIG. 8A and FIG. 8B are graphs illustrating an AFM image illustrating a surface morphology of the second embedding layer 21, and surface roughness of a cross-sectional surface taken along the line A-A in FIG. 8A, respectively.

As illustrated in FIG. 8B, it was confirmed that the surface of the second embedding layer 21 had a step-terrace structure with a step height equivalent to a height of one bilayer of GaN and an atomically flat GaN (0001) plane was able to be obtained.

As described above, in the formation of the first embedding layer 14A, the embedding by mass transport is ended so as to have the surface condition in which the pits PT appear on the surface of the first embedding layer 14A, thus forming the first embedding layer 14A. The first embedding layer 14A is preferably formed so as to have the state in which the pits PT are regularly arrayed at least partially and remain on the surface of the first embedding layer 14A.

This is because when the pits PT are completely buried by migration atoms and/or molecules formed of Ga and/or GaN in mass transport during the formation of the first embedding layer 14A and the first embedding layer 14A becomes to have the surface condition similar to the other part, the migration atoms and/or molecules aggregate in a defective part or a part with transition remaining on the first embedding layer 14A to form a hillock (projecting portion), and this inhibit flattening of the second embedding layer 21.

Additionally, this is because as long as the pits PT become starting points of growth (regrowth) of the second embedding layer 21 or there is the surface condition in which the pits PT remain and not necessarily to be regular, the uniformity and flattening of the second embedding layer 21 are achieved.

For flattening with the pits PT embedded, the layer thickness of the second embedding layer 21 is preferably larger than the layer thickness of the first embedding layer 14A.

While the description has been given with the example of growing GaN as the second embedding layer 21, the crystal composition of the second embedding layer 21 may differ from that of the first embedding layer 14A. As the second embedding layer 21, another crystal, for example, a ternary crystal or quaternary crystal, GaN-based semiconductor crystal layer may be formed. For example, as the second embedding layer 21, a crystal layer that contains In in the composition, such as an InGaN layer, can be used. Additionally, formation of a crystal layer having a refractive index with respect to an emission wavelength higher than that of the first embedding layer as the second embedding layer 21 allows increasing the coupling coefficient $\kappa_3$ compared with the case of the GaN crystal layer.

The temperature at which the second embedding layer 21 is formed is preferably in a range of from 750° C. to 1150° C. in a case where the constituent material is GaN and in a range of from 750° C. to 900° C. in a case where the constituent material is InGaN.

[Growth of Active Layer, p-Side Semiconductor Layer]

Subsequently, as the active layer 15, a multi-quantum well (MQW) layer was grown. A barrier layer and a well layer of the MQW were GaN and InGaN, respectively. After the temperature of the substrate was decreased down to 800° C., triethyl gallium (TEG) was supplied as a supply source of group III atoms and NH$_3$ was supplied as a nitrogen source, thus growing the barrier layer. The temperature same as that of the barrier layer was set, TEG and trimethyl indium (TMI) were supplied as supply sources of the group III atom and NH$_3$ was supplied as a nitrogen source, thus growing the well layer. A center wavelength of PhotoLuminescence (PL) light from the active layer 15 in the embodiment was 410 nm.

After the growth of the active layer 15, the substrate was maintained at 800° C., and the p-side guide layer 16 was grown at the layer thickness of 100 nm. TEG and NH$_3$ were supplied, and the p-side guide layer 16 was grown as undoped GaN (u-GaN) to which a dopant was not doped.

After the growth of the p-side guide layer 16, the substrate temperature was increased up to 1050° C. at a speed of 100° C./min to grow the electron blocking layer (EB L) 17 and the p-clad layer 18. TMG and TMA were supplied as group III atom sources and NH$_3$ was supplied as a nitrogen source, thus growing the EBL 17. TMG and TMA were supplied as group III atom sources and NH$_3$ was supplied as a nitrogen source, thus growing the p-clad layer 18. Al concentrations of the EBL 17 and the p-clad layer 18 were 18% and 6%, and layer thicknesses were 17 nm and 600 nm, respectively. In the respective growths of the EBL 17 and the p-clad layer 18, Bis-cyclopentadienyl magnesium (Cp2Mg) was suppled as a dopant simultaneously with a group III atom source gas and the nitrogen source. The p-clad layer (p-AlGaN clad layer) 18 activated in the air at 700° C. for five minutes had a carrier density of $4 \times 10^{17}$ cm$^{-3}$.

[Coupling Coefficient $\kappa_3$]

As described above, to reduce the resonator loss in the photonic crystal surface emitting laser and perform the oscillation operation at the low threshold current density, it is effective to increase the coupling coefficient $\kappa_3$ of the light wave propagating inside the photonic crystal layer 14P surface.

Figure 9:
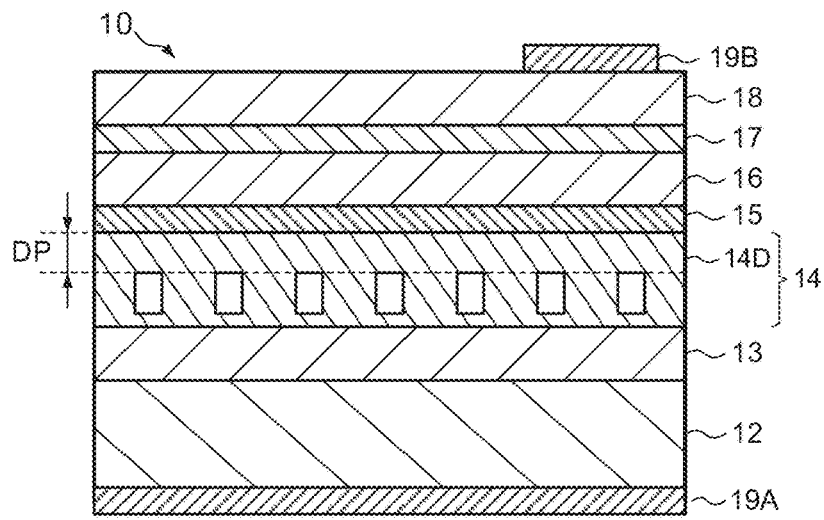
FIG. 9 is a drawing illustrating a cross-sectional structure of a GaN-based photonic crystal surface emitting laser element used to calculate a light coupling coefficient 10 by coupled wave equation.

To examine this point, by solving the coupled wave equation of the GaN-based photonic crystal surface emitting laser element having the structure illustrated in FIG. 9, the light coupling coefficient $\kappa_3$ was calculated.

The photonic crystal surface emitting laser used to calculate the light coupling coefficient $\kappa_3$ illustrated in FIG. 9 has the structure in which the n-clad layer 13 (n-Al$_{0.04}$Ga$_{0.96}$N: layer thickness 2,000 nm), the n-guide layer 14 (n-GaN: layer thickness 120 nm), the photonic crystal layer 14P (n-GaN: layer thickness 120 nm), the embedding layer 14D (n-GaN: layer thickness DP=0 to 120 nm), the active layer 15 (quantum well layer (MQW having two layers of (u-In$_{0.08}$Ga$_{0.82}$N)), the p-side guide layer 16 (u-GaN: layer thickness 120 nm), the EBL 17 (p-Al$_{0.18}$Ga$_{0.82}$N: layer thickness 17 nm), and the P-clad layer 18 (p-Al$_{0.06}$Ga$_{0.94}$N: layer thickness 600 nm) are stacked in this order.

Figure 10A:
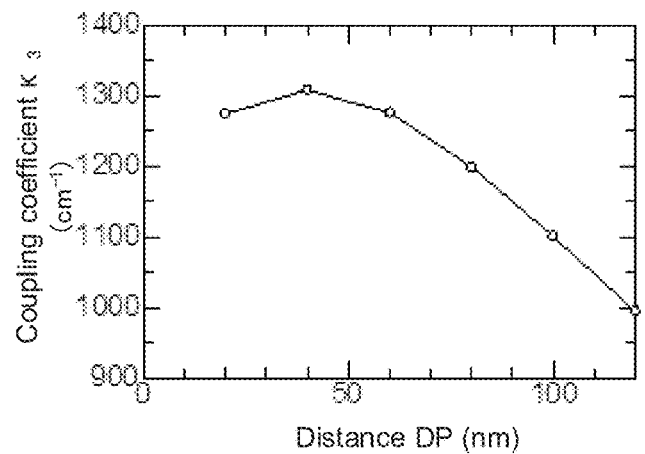
FIG. 10A is a graph illustrating a change in the coupling coefficient $\kappa_3$ relative to a layer thickness DP of an embedding layer 14D (a distance between an active layer 15 and a photonic crystal layer 14P).
Figure 10B:
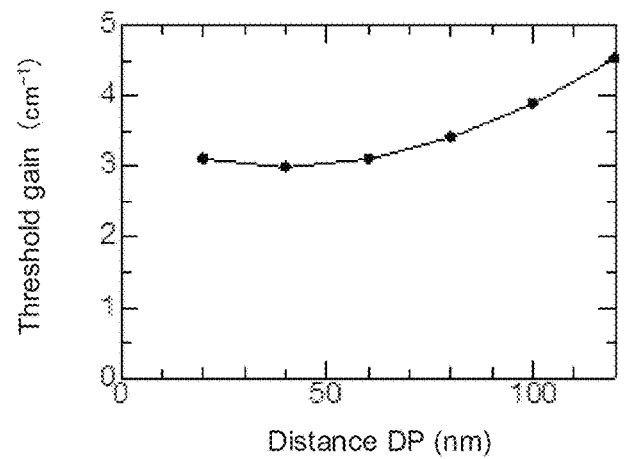
FIG. 10B is a graph illustrating a change in a threshold gain relative to the layer thickness DP of the embedding layer 14D.

FIG. 10A and FIG. 10B illustrate the respective changes in the coupling coefficient $\kappa_3$ and the threshold gain relative to the layer thickness DP of the embedding layer 14D, that is, a distance between the active layer 15 and the photonic crystal layer 14P. FIG. 10A and FIG. 10B illustrate the case of a filling factor (FF) of 6%.

As illustrated in FIG. 10A and FIG. 10B, it is seen that, to increase the coupling coefficient $\kappa_3$ and perform the oscillation operation at the low threshold current density, the sum layer thickness (or the distance between the active layer 15 and the photonic crystal layer 14P) DP of the first embedding layer 14A and the second embedding layer 21 is preferably 100 nm or less. The sum layer thickness is preferably in a range of from 20 nm to 100 nm.

As described above, in the embodiment, (i) annealing is performed on the guide layer substrate in which the voids CH having the two-dimensional periodicity are formed in the n-guide layer 14 while the gas containing the nitrogen source is supplied to close the openings of the voids by mass transport, thus forming the first embedding layer, and (ii) the group III raw material and the gas containing the nitrogen source are supplied to form the first embedding layer.

When the temperature increases up to the temperature at which mass transport occurs, the void shape changes such that surface energy becomes the smallest. That is, for example, side surfaces of the void of the C-plane GaN deform to the {10-10} planes where a dangling bond density is small. The voids are closed (obstructed) by annealing, and the first embedding layer having the surface formed of the (0001) plane is formed. At this time, the surface of the first embedding layer becomes the step-terrace structure in which bunching is performed at the width same as the cyclic interval of the voids. Since the annealing temperature is a temperature at which the mass transport occurs, the annealing temperature when the voids CH are closed in a case where the n-guide layer is formed of GaN is preferably in a range of from 1000° C. to 1200° C.

Additionally, the first embedding layer is formed of the same elements as that of the n-guide layer forming the voids.

The second embedding layer is formed by supplying the group III raw material to newly grow a layer. Accordingly, like the first embedding layer, the second embedding layer needs not to be formed of the element same as the n-guide layer forming the voids. However, from an aspect of light confinement, the second embedding layer is preferably made of a material having a refractive index to the same extent or more than that of the first embedding layer.

With the second embedding layer, the bunched surface structure of the first embedding layer is recovered, and the surface of the step-terrace structure with the step height equivalent to the height of one bilayer is obtained. Accordingly, the surface of the second embedding layer becomes the atomically flat (0001) plane.

The above-described method allows the distance between the photonic crystal layer and the active layer in the GaN-based photonic crystal surface emitting laser to be 100 nm or less. That is, in the GaN-based material photonic crystal surface emitting laser, the photonic crystal surface emitting laser in which the light coupling coefficient $\kappa_3$ can be increased and the oscillation operation can be performed at the low threshold current density can be achieved.

[Void Embedding Method and Structure of Comparative Example]

Figure 11:
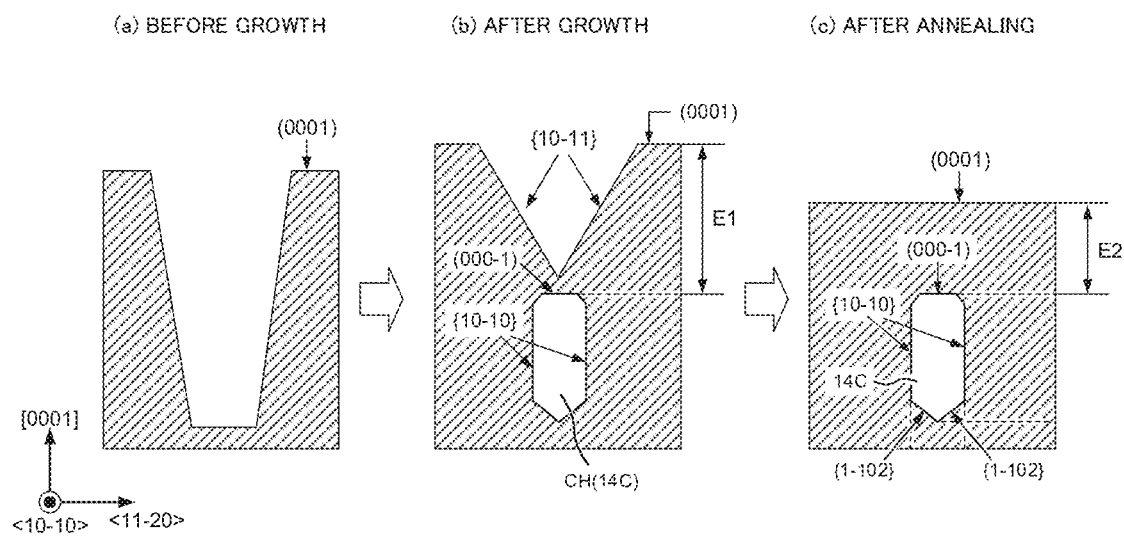
FIG. 11 is a schematic diagram illustrating an embedding method of voids as Comparative Example of the Embodiment.

FIG. 11 is a schematic diagram illustrating the embedding method of voids as Comparative Example of the Embodiment. Comparative Example is similar to the embodiment in that the SiNx films SN of the guide layer substrate in which the voids CH having the two-dimensional periodicity are formed in the n-guide layer 14 are removed using the hydrofluoric acid (HF), cleaning is performed to obtain the cleaned surface, and the resultant product is introduced into the MOVPE apparatus again (FIG. 11 (a)).

In Comparative Example, the guide layer substrate was heated to 1050° C. in the MOVPE apparatus, the group III material gas (TMG) and the group V material gas (NH$_3$) were supplied to perform crystal growth so as to form a depressed portion having the {10-11} facets on the substrate surface, and the opening of the void CH was closed (FIG. 11 (b)).

At this time, a distance E1 between the (000-1) plane as the top surface of the embedded void CH and the (0001) plane as the outermost surface of the n-guide layer 14 was approximately 140 nm (FIG. 11(b)).

After the void CH was closed by the {10-11} facets, the supply of the group III material gas was stopped, the temperature was increased up to 1150° C. at a temperature increase speed of 100° C./min while the V group material gas (NH$_3$) was supplied, and the temperature was held for one minute. This eliminates the {10-11} facets formed on the surface of the n-guide layer 14, and the surface became the flat (0001) plane. That is, the surface was flattened by mass transport.

At this time, a distance E2 between the surface (the top surface, the (000-1) plane) on the active layer 15 side of the void (cavity) 14C formed to be embedded and the surface (that is, the (0001) plane) of the n-guide layer 14 was approximately 105 nm.

That is, the void embedding method of Comparative Example preferentially grows the {10-11} facets to close the void, and subsequently forms the (0001) plane on the surface by annealing. The manufacturing method can thin the distance between the photonic crystal layer 14P and the active layer 15 only around 100 nm. That is, this method cannot increase the light coupling coefficient κ$_3$ in the GaN-based photonic crystal surface emitting laser, and the oscillation operation at the low threshold current density is difficult.

[Crystallinity: SIMS Analysis]

Since oxygen is taken in during the formation of the void CH in the n-guide layer 14 by etching, oxygen is unintentionally taken into the first embedding layer as well.

In the above-described embodiment, since the group III material gas (TMG), the group V material gas (NH$_3$), and hydrogen (H$_2$) are supplied to form the second embedding layer 21, the oxygen unintentionally taken into the second embedding layer 21 significantly decreases. For example, the oxygen taken into the second embedding layer 21 becomes $5\times10^{16}$ cm$^{-3}$ or less.

Figure 12:
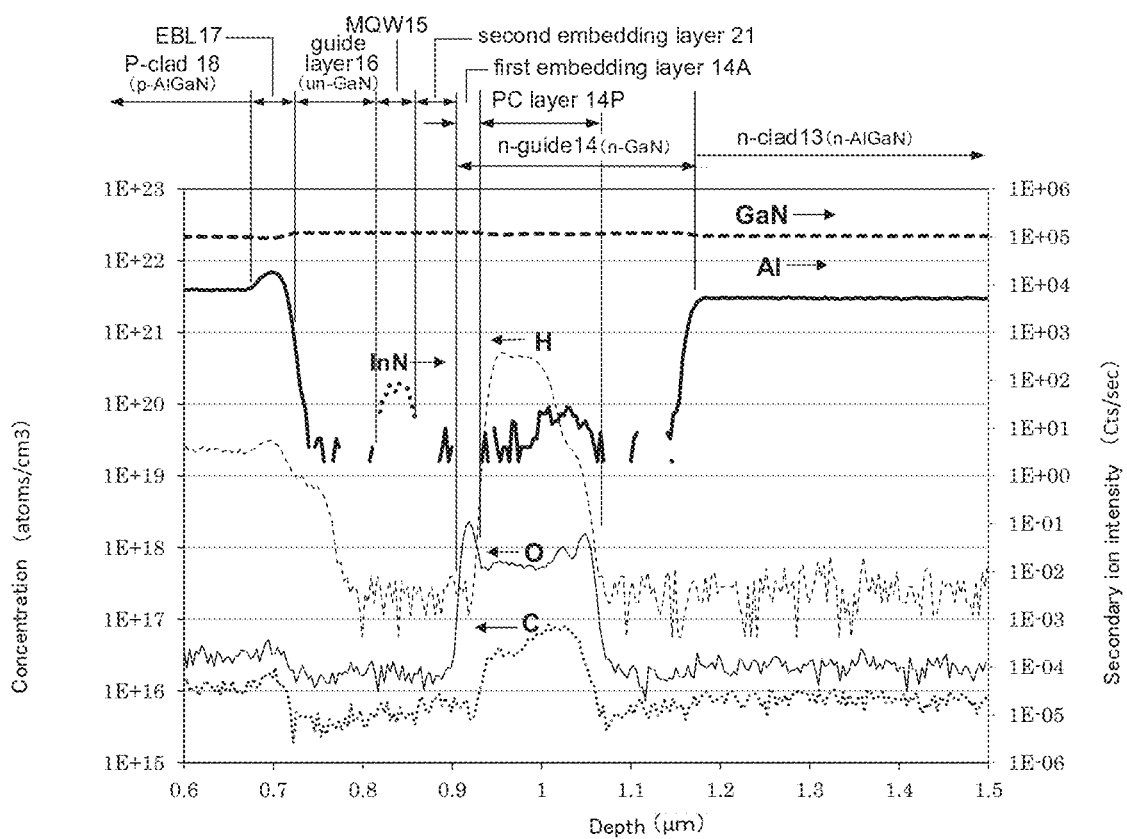
FIG. 12 is a graph illustrating results of SIMS analysis of a semiconductor structure layer 11 of the embodiment.

FIG. 12 illustrates results of a secondary ion mass spectrometry (SIMS) analysis of the semiconductor structure layer 11 of the embodiment formed as described above. FIG. 12 illustrates the analysis results from a part of the p-clad layer 18 to a part of the n-clad layer 13. As shown by the concentration profile of oxygen (O), it was confirmed that while the oxygen mixed during the etching to form the voids CH was present by $3\times10^{18}$ cm$^{-3}$ in the first embedding layer 14A, the oxygen concentration in the second embedding layer 21 was $2\times10^{16}$ cm$^{-3}$ or less (detection lower limit or less).

Thus, it was confirmed that, in the second embedding layer 21, generation of group III atom voids in the crystal due to doping of high concentration oxygen was suppressed, and the film with satisfactory crystalline was able to be obtained. Therefore, the crystal layer growing on the second embedding layer 21 also has satisfactory crystallinity.

Various kinds of values and the like in the embodiment are merely examples and are appropriately changeable within the range not departing from the scope of the present invention.

While the description has been given in the embodiment with the example of the semiconductor structure layer 11 including the electron blocking layer 17, the electron blocking layer 17 may be omitted. Alternatively, the semiconductor structure layer 11 may include any semiconductor layer including a contact layer and a current diffusion layer.

Additionally, while this Specification has given the description with an example in which the first conductivity type semiconductor (the n-type semiconductor), the active layer, and the second conductivity type semiconductor (the p-type semiconductor as a conductivity type opposite to the first conductivity type) are grown in this order, the first conductivity type may be a p-type and the second conductivity type may be an n-type.

As details have been described above, the present invention allows providing the surface emitting laser that allows increasing the coupling coefficient κ$_3$ of the light wave propagating in the direction parallel to the photonic crystal layer, reducing the resonator loss, and can perform the oscillation operation at the low threshold current density, and the manufacturing method of the surface emitting laser.

DESCRIPTION OF REFERENCE SIGNS

10: photonic crystal surface emitting laser
12: substrate
13: n-clad layer
14: n-guide layer
14A: first embedding layer
14P: photonic crystal layer
14C: voids
15: active layer
16: guide layer
18: p-clad layer
21: second embedding layer

The invention claimed is:

1. A surface emitting laser element formed of a group III nitride semiconductor, comprising:
    a first clad layer of a first conductivity type;
    a first guide layer of the first conductivity type having a photonic crystal layer formed on the first clad layer including voids disposed having two-dimensional periodicity in a surface parallel to the layer and a first embedding layer formed on the photonic crystal layer wherein the first embedding layer closes the voids;
    a second embedding layer formed on the first embedding layer by crystal growth;
    an active layer formed on the second embedding layer;
    a second guide layer formed on the active layer; and
    a second clad layer of a second conductivity type formed on the second guide layer, the second conductivity type being a conductivity type opposite to the first conductivity type,
    wherein the first embedding layer has a surface including pits disposed at surface positions corresponding to the voids.

2. The surface emitting laser element according to claim 1, wherein the surface of the first embedding layer includes the regularly arrayed pits corresponding to the voids.

3. The surface emitting laser element according to claim 1, wherein the second embedding layer has a crystal composition different from a crystal composition of the first embedding layer.

4. The surface emitting laser element according to claim 1, wherein the first embedding layer has a crystal composition identical to a crystal composition of the photonic crystal layer.

5. The surface emitting laser element according to claim 1, wherein the second embedding layer is a crystal layer having a refractive index equal to or more than a refractive index of the first embedding layer to an emission wavelength from the active layer.

6. The surface emitting laser element according to claim 1, wherein the second embedding layer includes In as a crystal composition thereof.

7. The surface emitting laser element according to claim 1, wherein a sum layer thickness of the first embedding layer and the second embedding layer is in a range of from 20 nm to 100 nm.

8. The surface emitting laser element according to claim 1, wherein the surface of the first embedding layer is a (0001) plane and has a step-terrace structure including bunching steps bunched at an interval of the voids.

9. The surface emitting laser element according to claim 1, wherein a surface of the second embedding layer is a (0001) plane and has a step-terrace structure with a step height equivalent to a height of one bilayer.

10. The surface emitting laser element according to claim 1, wherein at least one of a plurality of side surfaces of each of the voids is a {10-10} facet.

11. The surface emitting laser element according to claim 1, wherein a concentration of oxygen included in the second embedding layer is $5\times10^{16}$ cm$^{-3}$ or less.

12. A manufacturing method for manufacturing a surface emitting laser element formed of a group Ill nitride semiconductor by a MOVPE method, the manufacturing method comprising:
(a) growing a first clad layer of a first conductivity type on a substrate;
(b) growing a first guide layer of the first conductivity type on the first clad layer;
(c) forming hole portions disposed having two-dimensional periodicity in a surface parallel to the first guide layer in the first guide layer by etching;
(d) supplying a gas containing a nitrogen source to form a first embedding layer closing openings of the hole portions by mass transport;
(e) supplying a group Ill raw material after the formation of the first embedding layer to form a second embedding layer that embeds the first embedding layer for flattening,
wherein in step (d), the first embedding layer has a surface including pits derived from voids.

13. The manufacturing process according to claim 12, wherein in the step (c), the periodically disposed hole portions with two perpendicular axes as arrayed directions are formed in the first guide layer.

14. The manufacturing method according to any one of claim 12, wherein the first embedding layer has the surface including regularly arrayed pits corresponding to the voids.

* * * * *